United States Patent
Pagaila et al.

(10) Patent No.: US 8,101,460 B2
(45) Date of Patent: Jan. 24, 2012

(54) SEMICONDUCTOR DEVICE AND METHOD OF SHIELDING SEMICONDUCTOR DIE FROM INTER-DEVICE INTERFERENCE

(75) Inventors: Reza A. Pagaila, Singapore (SG); Byung Tai Do, Singapore (SG); Heap Hoe Kuan, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 407 days.

(21) Appl. No.: 12/133,216

(22) Filed: Jun. 4, 2008

(65) Prior Publication Data

US 2009/0302435 A1  Dec. 10, 2009

(51) Int. Cl.
*H01L 21/00* (2006.01)
*H01L 21/302* (2006.01)
*H01L 21/461* (2006.01)
*H01L 23/552* (2006.01)

(52) U.S. Cl. ............ 438/109; 438/26; 438/33; 438/731; 257/659; 257/E21.499; 257/E23.114

(58) Field of Classification Search .................. None
See application file for complete search history.

(56) References Cited

U.S. PATENT DOCUMENTS

| | | | |
|---|---|---|---|
| 6,670,206 B2 * | 12/2003 | Kim et al. ................ | 438/26 |
| 6,838,761 B2 | 1/2005 | Karnezos | |
| 7,145,084 B1 | 12/2006 | Sarihan et al. | |
| 7,208,335 B2 * | 4/2007 | Boon et al. .............. | 438/33 |
| 2004/0103509 A1 * | 6/2004 | Bidard et al. ........... | 29/25.35 |

* cited by examiner

*Primary Examiner* — Ha Tran T Nguyen
*Assistant Examiner* — Valerie N Brown
(74) *Attorney, Agent, or Firm* — Robert D. Atkins; Patent Law Group: Atkins & Associates, P.C.

(57) ABSTRACT

A plurality of stacked semiconductor wafers each contain a plurality of semiconductor die. The semiconductor die each have a conductive via formed through the die. A gap is created between the semiconductor die. A conductive material is deposited in a bottom portion of the gap. An insulating material is deposited in the gap and over the semiconductor die. A portion of the insulating material in the gap is removed to form a recess between each semiconductor die extending to the conductive material. A shielding layer is formed over the insulating material and in the recess to contact the conductive material. The shielding layer isolates the semiconductor die from inter-device interference. A substrate is formed as a build-up structure on the semiconductor die adjacent to the conductive material. The conductive material electrically connects to a ground point in the substrate. The gap is singulating to separate the semiconductor die.

25 Claims, 14 Drawing Sheets

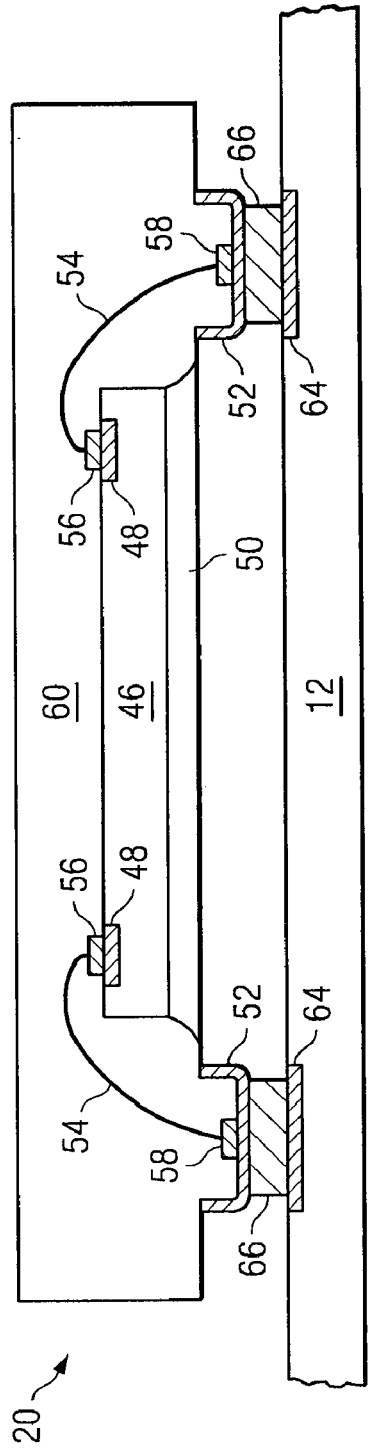
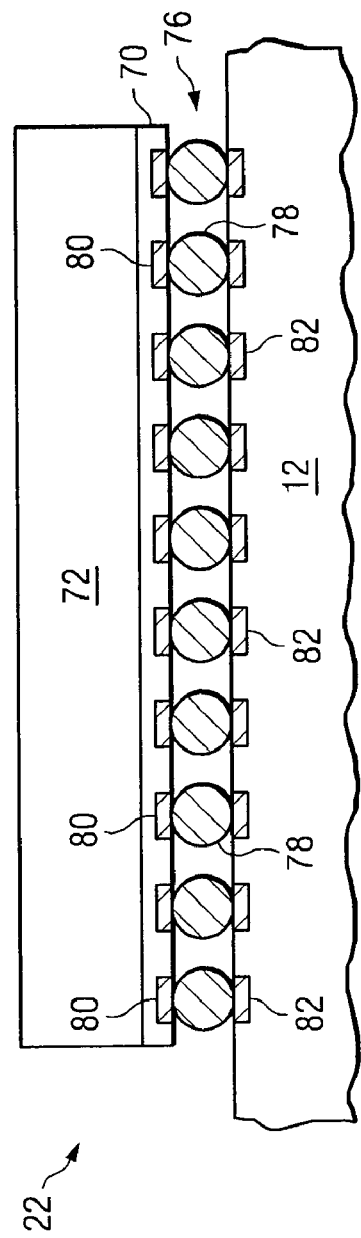
FIG. 2c
FIG. 2d

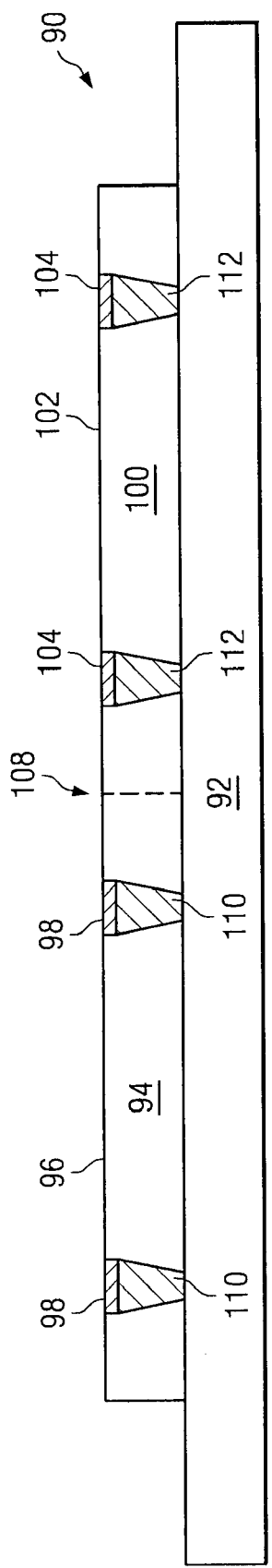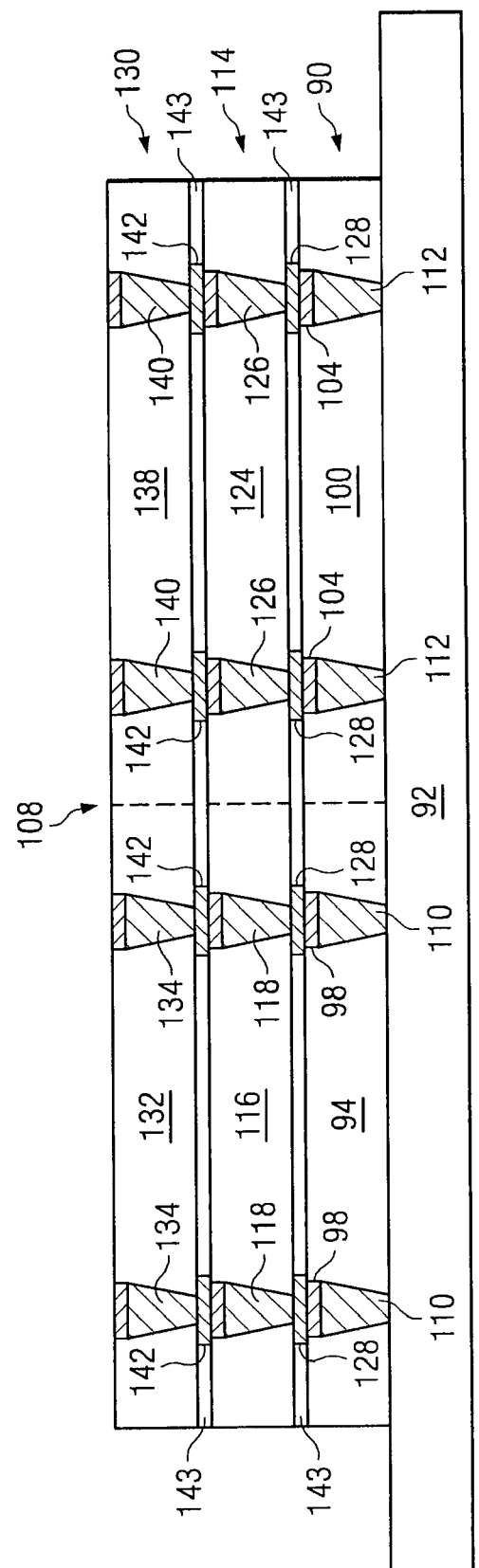

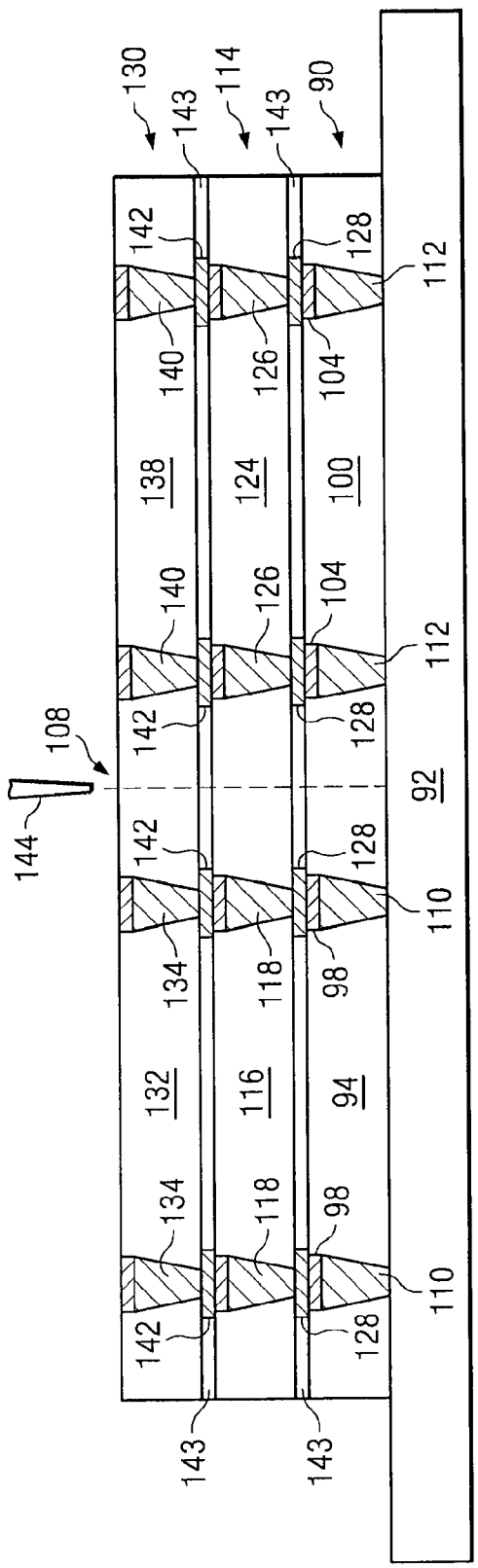
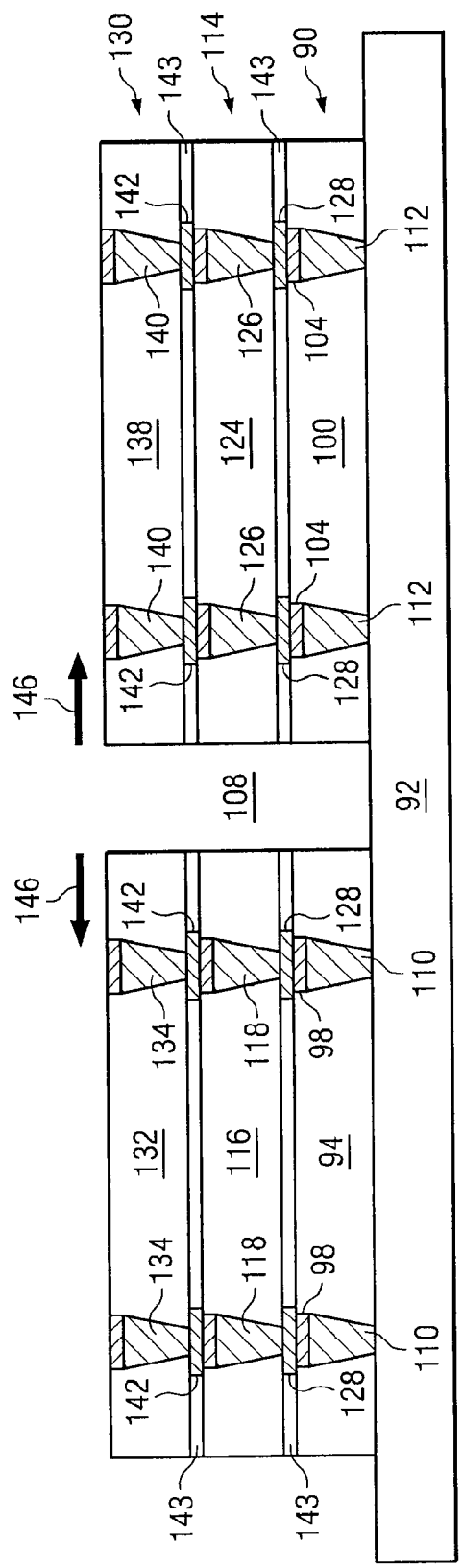
FIG. 3c
FIG. 3d

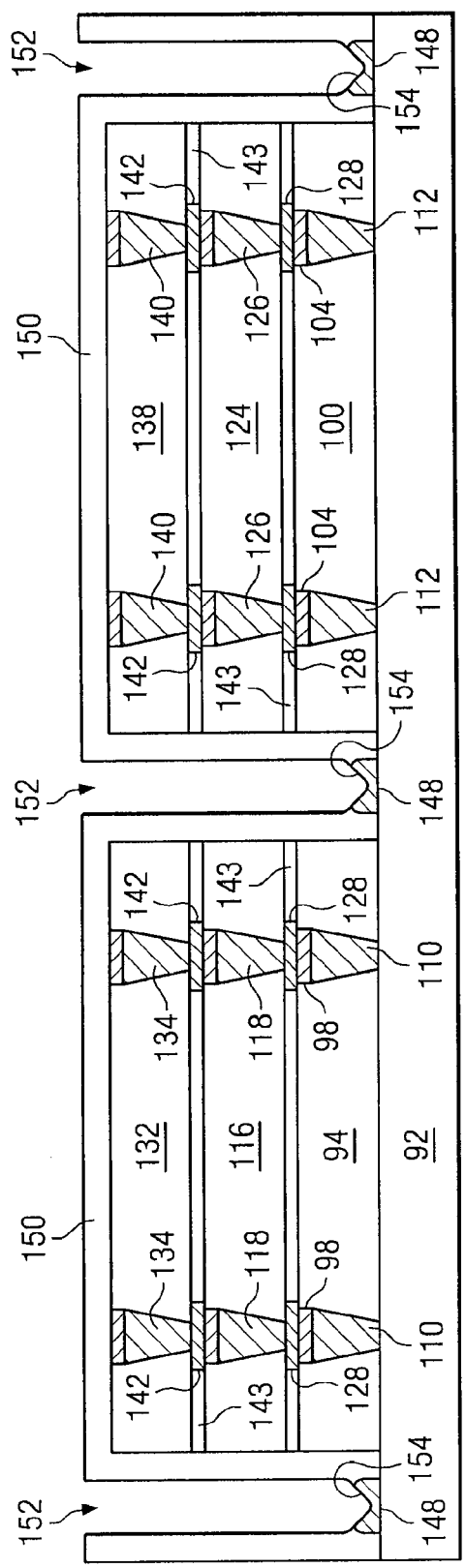
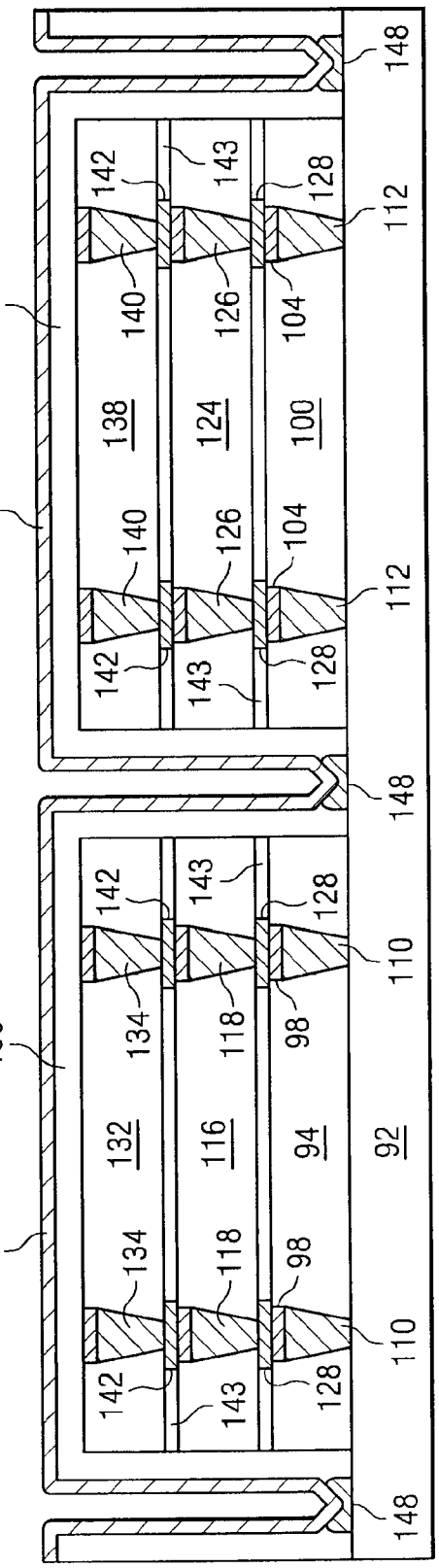
FIG. 3g
FIG. 3h

SEMICONDUCTOR DEVICE AND METHOD OF SHIELDING SEMICONDUCTOR DIE FROM INTER-DEVICE INTERFERENCE

FIELD OF THE INVENTION

The present invention relates in general to semiconductor devices and, more particularly, to a semiconductor device having a shielding layer for isolation with respect to electromagnetic interference, radio frequency interference, and other inter-device interference.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, most IPDs generate undesired electromagnetic interference (EMI) and radio frequency interference (RFI), or other inter-device interference, such as capacitive, inductive, or conductive coupling, also known as cross-talk, which can interfere with the operation of adjacent circuit elements.

Various attempts have been made to shield the semiconductor devices from undesirable EMI and RFI by using metal enclosures, e.g., Faraday cage. However, encasing each stacked semiconductor device increases the total size of the package due to the space taken by the cage. The time required to mount a shielding cage on every stacked device increases manufacturing costs and reduces productivity.

SUMMARY OF THE INVENTION

A need exists to shield semiconductor die from EMI, RFI, and other inter-device interference. Accordingly, in one embodiment, the present invention is a method of making a semiconductor device comprising the steps of providing a first semiconductor wafer having a plurality of semiconductor die, creating a gap between the semiconductor die, depositing a conductive material in a bottom portion of the gap, depositing an insulating material in the gap and over the semiconductor die, removing a portion of the insulating material in the gap to form a recess between each semiconductor die extending to the conductive material, and forming a shielding layer over the insulating material and in the recess to contact the conductive material. The shielding layer isolates the semiconductor die from inter-device interference. The method further includes the steps of forming a substrate with a build-up structure on the semiconductor die adjacent to the conductive material, electrically connecting the conductive material to a ground point in the substrate, and singulating the first semiconductor wafer through the gap to separate the semiconductor die.

In another embodiment, the present invention is a method of making a semiconductor device comprising the steps of providing a first semiconductor wafer having a plurality of semiconductor die, disposing a second semiconductor wafer having a plurality of semiconductor die over the first semiconductor wafer so that the semiconductor die in the first and second wafers are aligned, creating a gap between the semiconductor die of the first and second semiconductor wafers, depositing a conductive material in a bottom portion of the gap, depositing an insulating material in the gap and over the semiconductor die of the first and second semiconductor wafers, removing a portion of the insulating material in the gap to form a recess between each semiconductor die extending to the conductive material, and forming a shielding layer over the insulating material and in the recess to contact the conductive material. The shielding layer isolates the semiconductor die from inter-device interference. The method further includes the step of singulating the first and second semiconductor wafers through the gap to separate the semiconductor die.

In another embodiment, the present invention is a method of making a semiconductor device comprising the steps of creating a gap between a plurality of semiconductor die, depositing a conductive material in a bottom portion of the gap, depositing an insulating material in the gap and over the semiconductor die, removing a portion of the insulating material in the gap to form a recess between each semiconductor die extending to the conductive material, and forming a shielding layer over the insulating material and in the recess to contact the conductive material. The shielding layer isolates the semiconductor die from inter-device interference.

In another embodiment, the present invention is a semiconductor device comprising a semiconductor die including a conductive via. A stiffener ring is formed around the semiconductor die. An insulating layer is formed over the semiconductor die. A shielding layer is formed over the insulating material to isolate the semiconductor die from inter-device interference. The shielding layer electrically connects to the stiffener ring. A substrate is attached to the semiconductor die. The stiffener ring is electrically connected to a ground point in the substrate.

BRIEF DESCRIPTION OF THE DRAWINGS

FIGS. 2a-2d illustrate further detail of the semiconductor packages mounted to the PCB;

FIGS. 3a-3j illustrate a process of forming a shielding layer over stacked semiconductor die interconnected by conductive via;

FIG. 13 illustrates an ISM covered by a shielding layer which is connected to a conductive via.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
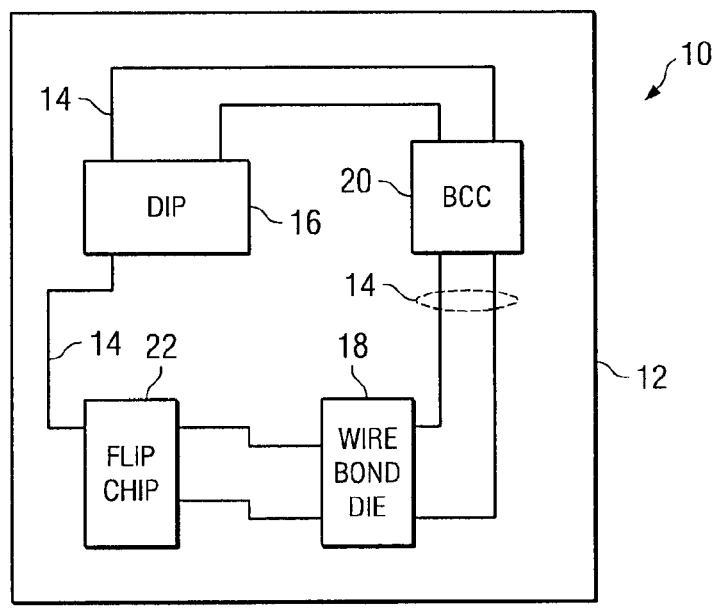
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer.

The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
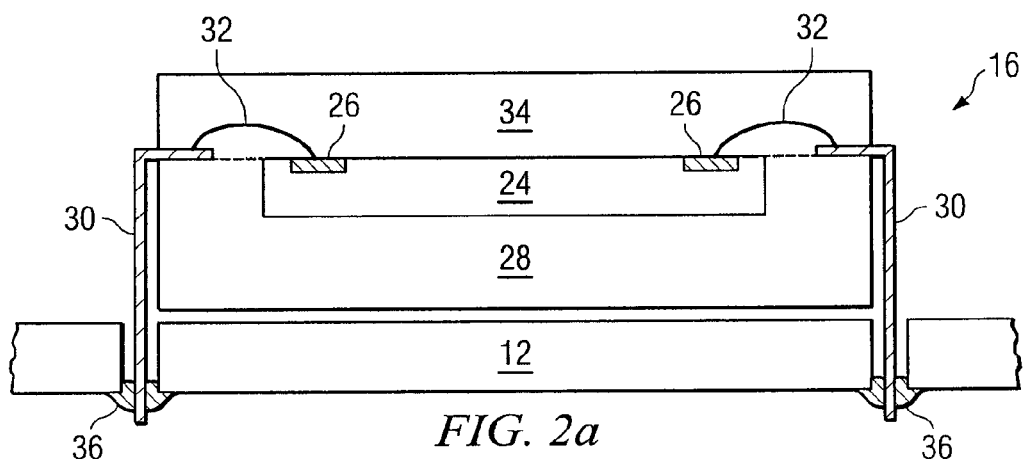

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
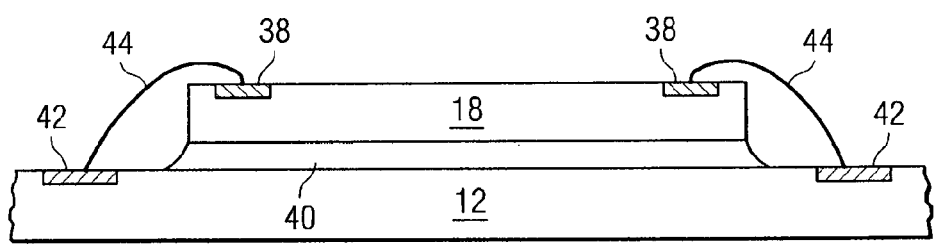

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Turning to FIG. 3a, a plurality of semiconductor die is formed on a semiconductor wafer 90 using conventional integrated circuit processes, as described above. The semiconductor wafer, containing semiconductor die 94 and 100, is mounted to expansion table 92 with ultraviolet (UV) tape. The backside of semiconductor die 94 is affixed to expansion table or carrier 92 with its front side, i.e., active surface 96 and contact pads 98, oriented face up. Likewise, the backside of semiconductor die 100 is mounted to expansion table 92 with its front side, i.e., active surface 102 and contact pads 104, oriented face up. Contact pads 98 and 104 electrically connect to active and passive devices and signal traces in active areas 96 and 102 of semiconductor die 94 and 100, respectively. A conductive through silicon via (TSV) 110 is disposed under and electrically connected to contact pads 98. A conductive TSV 112 is disposed under and electrically connected to contact pads 104. The conductive TSVs are formed by drilling or etching a hole through the silicon and depositing a conductive material in the hole. More generally, the conductive via 110 can be formed through any semiconductor material including gallium arsenide and germanium. A saw street 108 is disposed between semiconductor die 94 and 100.

FIG. 3b shows an embodiment with additional semiconductor wafers, each containing semiconductor die with conductive TSVs for electrical interconnection, stacked over semiconductor wafer 90. This configuration provides for stacking multiple semiconductor die within the shielding layer as described below. For example, a semiconductor wafer 114 is disposed on semiconductor wafer 90. Semiconductor wafer 114 is configured similar to wafer 90 including semiconductor die 116 having conductive TSV 118 disposed under and electrically connected to contacts pads on the active surface of die 116. Semiconductor die 124 includes conductive TSV 126 disposed under and electrically connected to contacts pads on the active surface of die 124. TSVs 118 and 126 electrically connect to contact pads 98 and 104, respectively, with bonding agents 128, such as conductive adhesive, metal-to-metal bonding, or other suitable electrically conductive union. A semiconductor wafer 130 is disposed on semiconductor wafer 114. Semiconductor wafer 130 is configured similar to wafer 90 including semiconductor die 132 having conductive TSV 134 disposed under and electrically connected to contacts pads on the active surface of die 132. Semiconductor die 138 includes conductive TSV 140 disposed under and electrically connected to contacts pads on the active surface of die 138. TSVs 134 and 140 electrically connect to the contact pads of semiconductor die 116 and 124 with bonding agents 142, such as conductive adhesive, metal-to-metal bonding, or other suitable electrically conductive union. In stacking semiconductor wafers 90, 114, and 130, semiconductor die 94, 116, and 132 are aligned to enable interconnection of the conductive TSVs. Likewise, semiconductor die 100, 124, and 138 are aligned to enable interconnection of the conductive TSVs. An adhesive or underfill material 143 is disposed between the stacked semiconductor wafers.

In FIG. 3c, a saw blade or laser tool 144 cuts through saw street 108 of semiconductor wafers 90, 114, and 130 in a dicing operation. In FIG. 3d, expansion table 92 moves in two-dimension lateral directions, as shown by arrows 146, to expand the width of saw street 108, i.e., form a gap and create a greater physical separation between the die. Expansion table 92 moves substantially the same distance in the x-axis and y-axis to provide equal separation around a periphery of each die. The post-expansion width of gap 108 ranges from 5 micrometers (μm) to 200 μm. The expanded gap 108 defines a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form a shielding layer within the gap, as described below.

Semiconductor die 94, 100, 116, 124, 132, and 138 may contain baseband circuits that are susceptible to electromagnetic interference (EMI), radio frequency interference (RFI), and other inter-device interference. In other embodiments, semiconductor die 94, 100, 116, 124, 132, and 138 may contain integrated passive devices (IPD) that generate EMI or RFI. For example, the IPDs contained within semiconductor die 94, 100, 116, 124, 132, and 138 provide the electrical characteristics needed for high frequency applications, such as high-pass filters, low-pass filters, band-pass filters, symmetric Hi-Q resonant transformers, and tuning capacitors. A typical RF system requires multiple IPDs in one or more semiconductor packages to perform the necessary electrical functions. However, most IPDs generate undesired EMI, RFI, or other inter-device interference, such as capacitive, inductive, or conductive coupling, also known as cross-talk, which can interfere with the operation of adjacent circuit elements. The interference can be generated internally or originate from external semiconductor devices containing IPDs or RF circuits. In any case, the EMI and RFI radiation should be blocked to avoid adversely influencing the operation of adjacent devices.

Figure 3E:
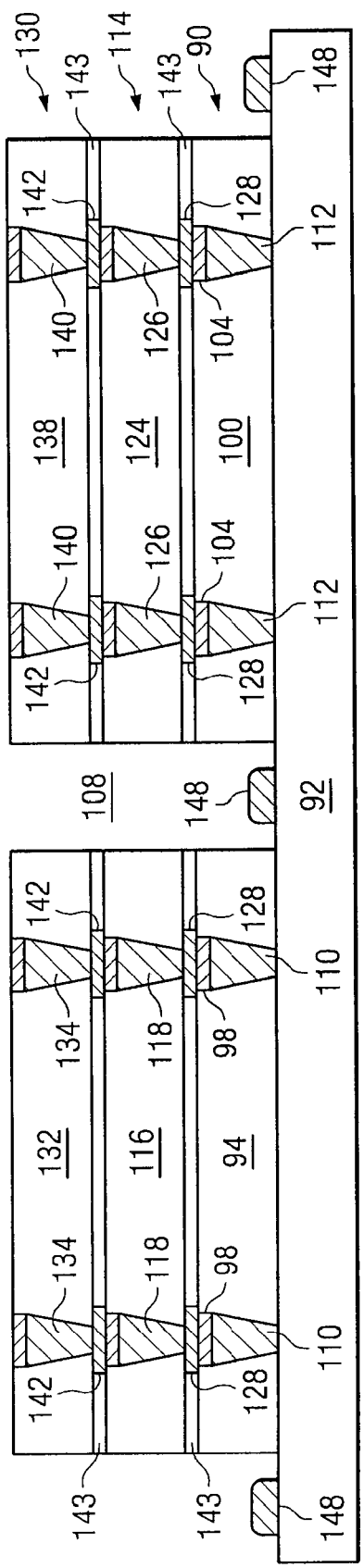

In FIG. 3e, a conductive material 148 is formed on expansion table 92 a predetermined distance from the adjacent semiconductor die. In one embodiment, conductive material 148 rings around each semiconductor die in a bottom portion of gap 108. Alternatively, conductive material 148 is disposed in specific areas in a bottom portion of gap 108 between the semiconductor die. Conductive material 148 is a stiffener ring or slot made with conductive epoxy, polymers, Al, Cu, Sn, Ni, Au, Ag, or other suitable conductive material. In one embodiment, stiffener ring 148 is placed at least 1 μm from the adjacent semiconductor die.

Figure 3F:
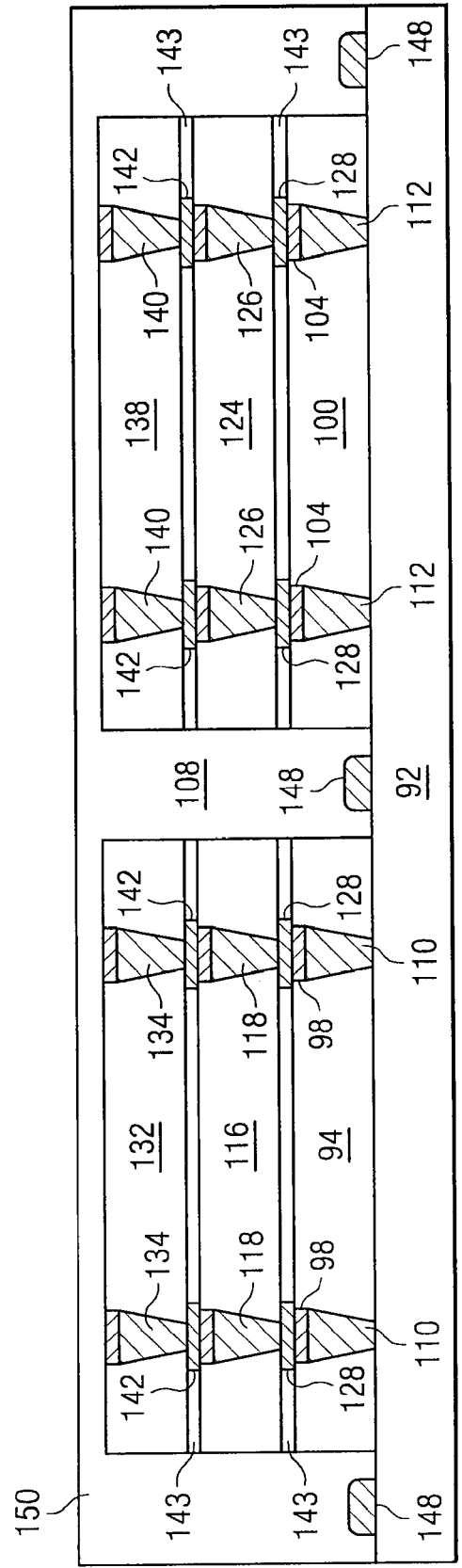

In FIG. 3f, an organic insulating material 150 is deposited in gap 108 and over semiconductor die 94, 100, 116, 124, 132, and 138 using spin coating, needle dispensing, or other suitable application process. Organic material 150 completely covers and encloses all sides of the semiconductor die above expansion table 92. Organic material 150 can be BCB, PI, or acrylic resin. Alternatively, other non-conductive materials such as a polymer molding compound, liquid epoxy molding, compression molding, soft laminating film, or other material having dielectric or electrical insulating properties can be deposited in gap 108. The non-conductive materials can also be deposited using a transfer molding or injection molding process. Organic material 150 completely covers semiconductor die 94, 100, 116, 124, 132, and 138 and stiffener ring 148 above expansion table 92.

In FIG. 3g, a portion of organic material 150 is removed by etching or laser drilling to stiffener ring 148. The removal of organic material 150 forms recesses 152 and exposes stiffener ring 148. The walls of recess 152 can be vertical or tapered. A tapered surface 154 is cut into stiffener ring 148.

In FIG. 3h, an electrically conductive material 158 is conformally deposited in recesses 152 with an optional seed layer. Conductive material 158 completely covers and encloses all sides of semiconductor die 94, 100, 116, 124, 132, and 138 above expansion table 92 to provide shielding for the semiconductor die against EMI, RFI, or other inter-device interference. Conductive material 158 electrically connects to stiffener ring 148. Conductive material 158 can be Cu, Al, stainless steel, nickel silver, low-carbon steel, silicon-iron steel, and other metals and composites capable of blocking EMI, RFI, and other inter-device interference. The seed layer can be made with Cu, Ni, nickel vanadium (NiV), Au, or Al. The seed layer and conductive material 158 are patterned and conformally deposited using an electrolytic plating, electroless plating, sputtering, PVD, CVD, or other suitable metal deposition process.

Figure 3I:
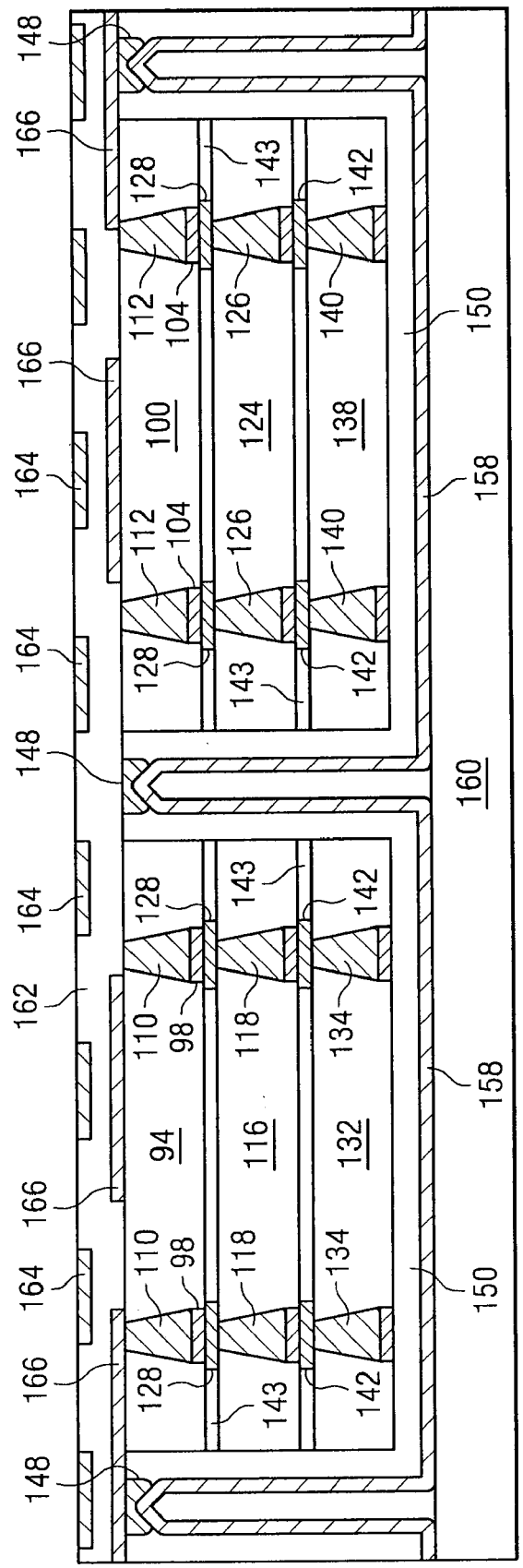
Figure 3J:
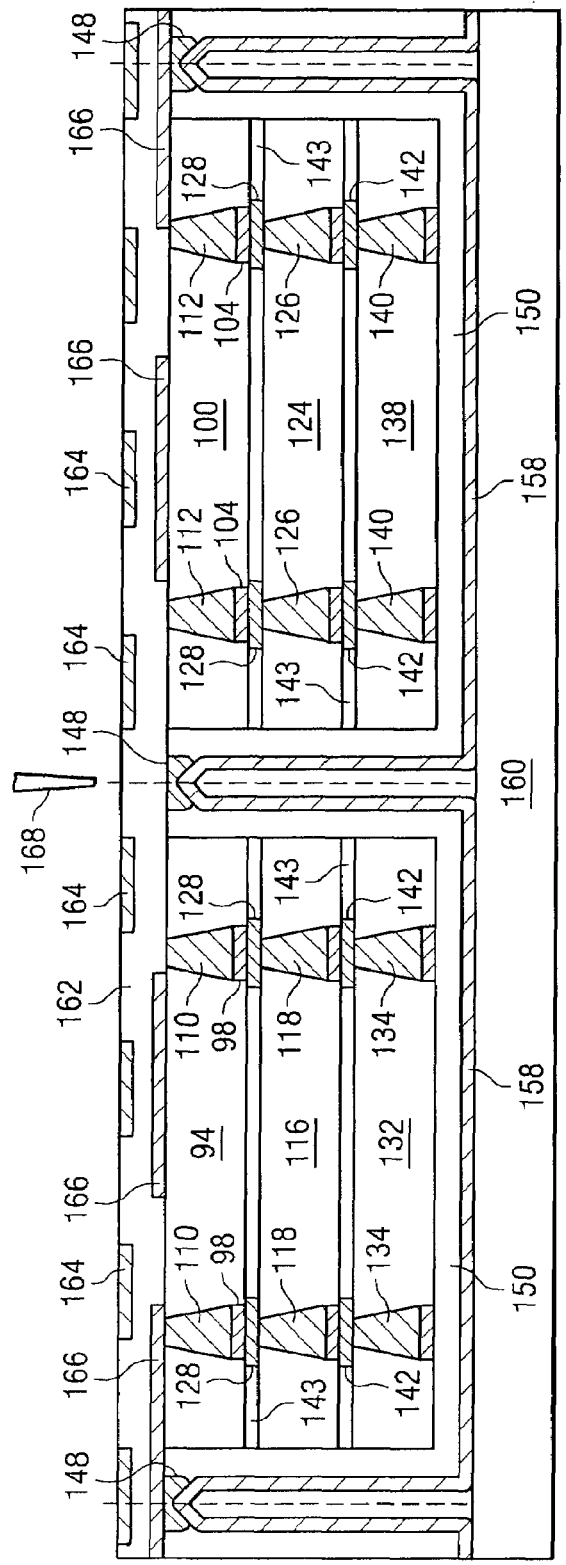

In FIG. 3i, the assembly is inverted and attached to wafer carrier 160 using UV or thermal release adhesive. The assembly is then removed from expansion table 92. A substrate 162 with build-up interconnect layers and structures 164 and 166 is formed on the backside of semiconductor die 94 and 100. Substrate 162 is typically built up layer-by-layer with corresponding lamination, deposition, and plating processes. Accordingly, substrate 162 includes contact pads, conduction channels, redistribution layers, and insulating layers as determined by the electrical design of the semiconductor device. In particular, contact pads 166 electrically connect to stiffener ring 148. As part of the substrate build-up interconnect structure, one or more contact pads 166 are electrically connected through a conduction channel in substrate 162 to one or more contact pads 164, which in turn electrically connect to an external low-impedance ground point to aid the shielding feature of conductive material 158. By stacking semiconductor die 94, 100, 116, 124, 132, and 138 prior to forming interconnect structures 162-164, the wafer expansion technology in FIG. 3d can be used to reduce production time. In addition, shielding layer 158 is formed over all semiconductor die 94, 100, 116, 124, 132, and 138 at the same time to save manufacturing steps and cost. Semiconductor wafers 90, 114, and 130 are singulated in FIG. 3j through a center portion of gap 108, i.e., between recesses 152. The gap region is cut by a cutting tool 168 such as a saw blade or laser. The cutting tool completely severs the semiconductor wafers through the gap region to separate the die.

Figure 4:
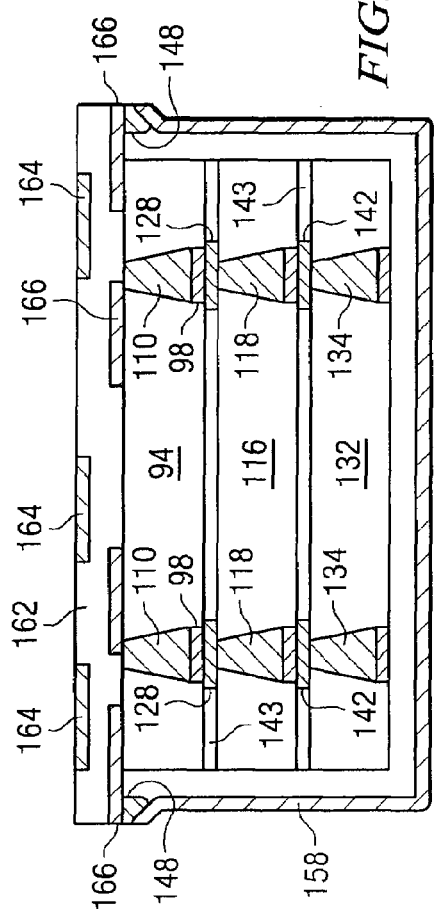
FIG. 4 illustrates a face-to-back ISM covered by a shielding layer and interconnected by conductive via.

The stacked semiconductor die are removed from carrier 160. FIG. 4 shows stacked semiconductor die 94, 116, and 132 as an internal stacking module (ISM) following wafer singulation with conformal shielding layer 158 covering the ISM. The shielding layer 158 provides advantages over conventional shielding cages. The wafer-level shielding is simultaneously formed over all semiconductor die in the ISM after creating recesses 152 to expose stiffener ring 148. The shielding layer provides isolation for the ISM with respect to EMI, RFI, or other inter-device interference. The build-up interconnect layers 162-166 are formed on the stacked semiconductor die. The ground path for shielding layer 158 includes stiffener ring 148 and grounded contact pads 164 and 166. Grounding shield layer 158 improves its shielding effectiveness.

In an alternate process, the build-up interconnection layer like 162-166 can be formed after encapsulation in FIG. 3f. The stacked wafers are transferred to another carrier to form recessed sections like 152 on a periphery of the semiconductor die. The shielding layer like 158 is then formed over all semiconductor die simultaneously, followed by singulation of the stacked wafers.

Figure 5:
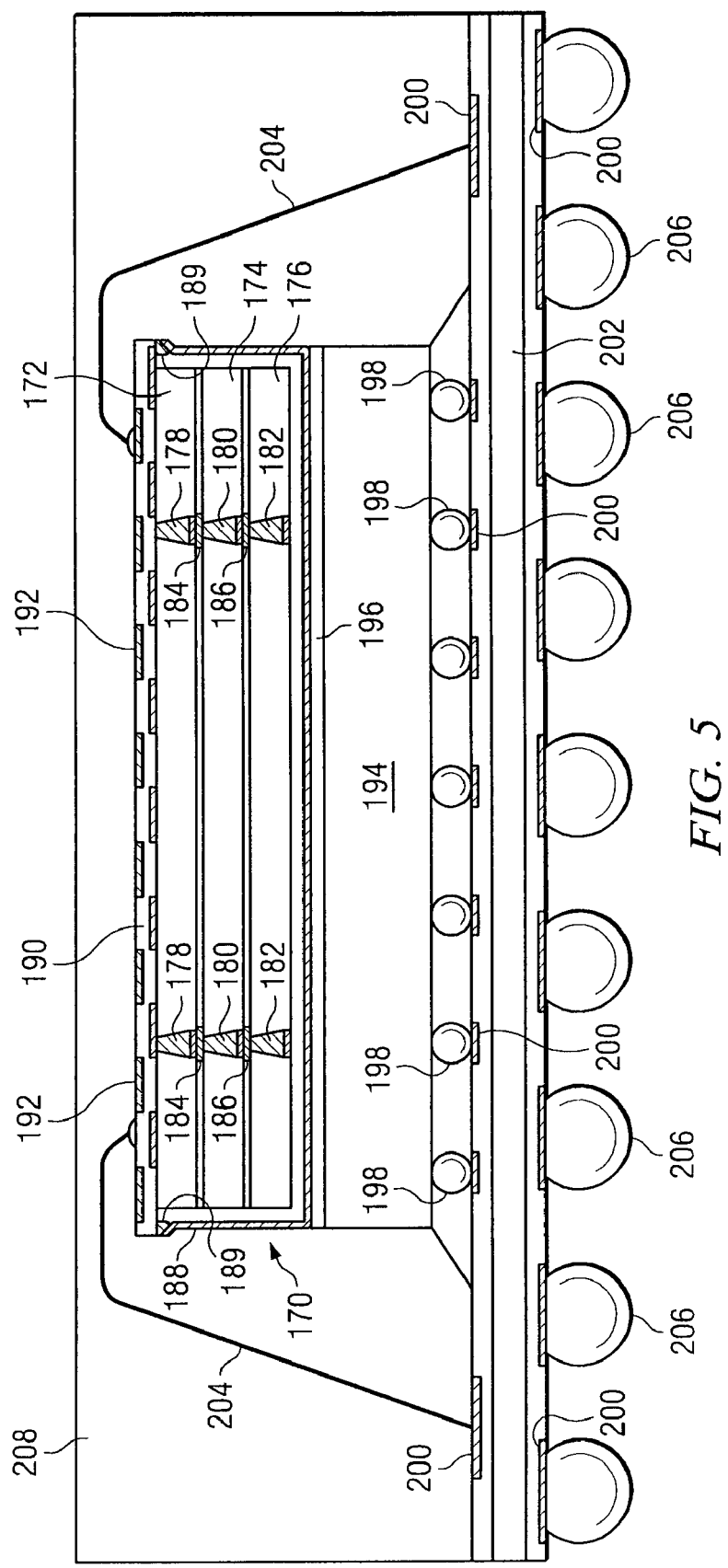
FIG. 5 illustrates an ISM covered by a shielding layer in PiP arrangement.

FIG. 5 illustrates the ISM from FIG. 4 in a package-in-package (PiP) configuration. ISM 170 includes stacked semiconductor die 172, 174, and 176 with interconnecting conductive TSV 178, 180, and 182, respectively. TSVs 178 electrically connect to TSVs 180 through bonding agent 184. TSVs 180 electrically connect to TSVs 182 through bonding agent 186. Shielding layer 188 covers semiconductor die 172-176. A substrate 190 with build-up interconnect structure 192 is formed on the backside of semiconductor die 172. Shielding layer 188 electrically connects to build-up interconnect structure 192 through stiffener ring 189. ISM 170 is attached to flip chip type semiconductor die or other semiconductor package 194 with adhesive material 196. Solder bumps 198 are formed on contact pads of semiconductor die 194 to electrically connect the flip chip semiconductor device to interconnect structures 200 on PCB 202. The ISM 170 also electrically connects to interconnect structures 200 in PCB 202 by way of bond wires 204. Solder bumps 206 are formed on interconnect structure 200 to provide external connectivity for the PiP device. In particular, the electrical conduction path for shielding layer 188 to an external ground point includes stiffener ring 189, interconnect structure 192, bond wire 204, interconnect structure 200, and solder bumps 206.

A molding compound or encapsulant 208 is deposited over ISM 170 and bond wires 204 and PCB 202. Molding compound 208 can be made with epoxy acrylate or other polymer material and applied by transfer molding, liquid encapsulant molding, or other molding process. Molding compound 208 is non-conductive and environmentally protects the semiconductor device from external elements and contaminants.

In one PiP embodiment, semiconductor die 172-176 are memory devices and semiconductor die 194 contains RF circuits. Shielding layer 188 blocks EMI, RFI, or other interference generated by die 194 from adversely influencing the operation of die 172-176.

Figure 6:
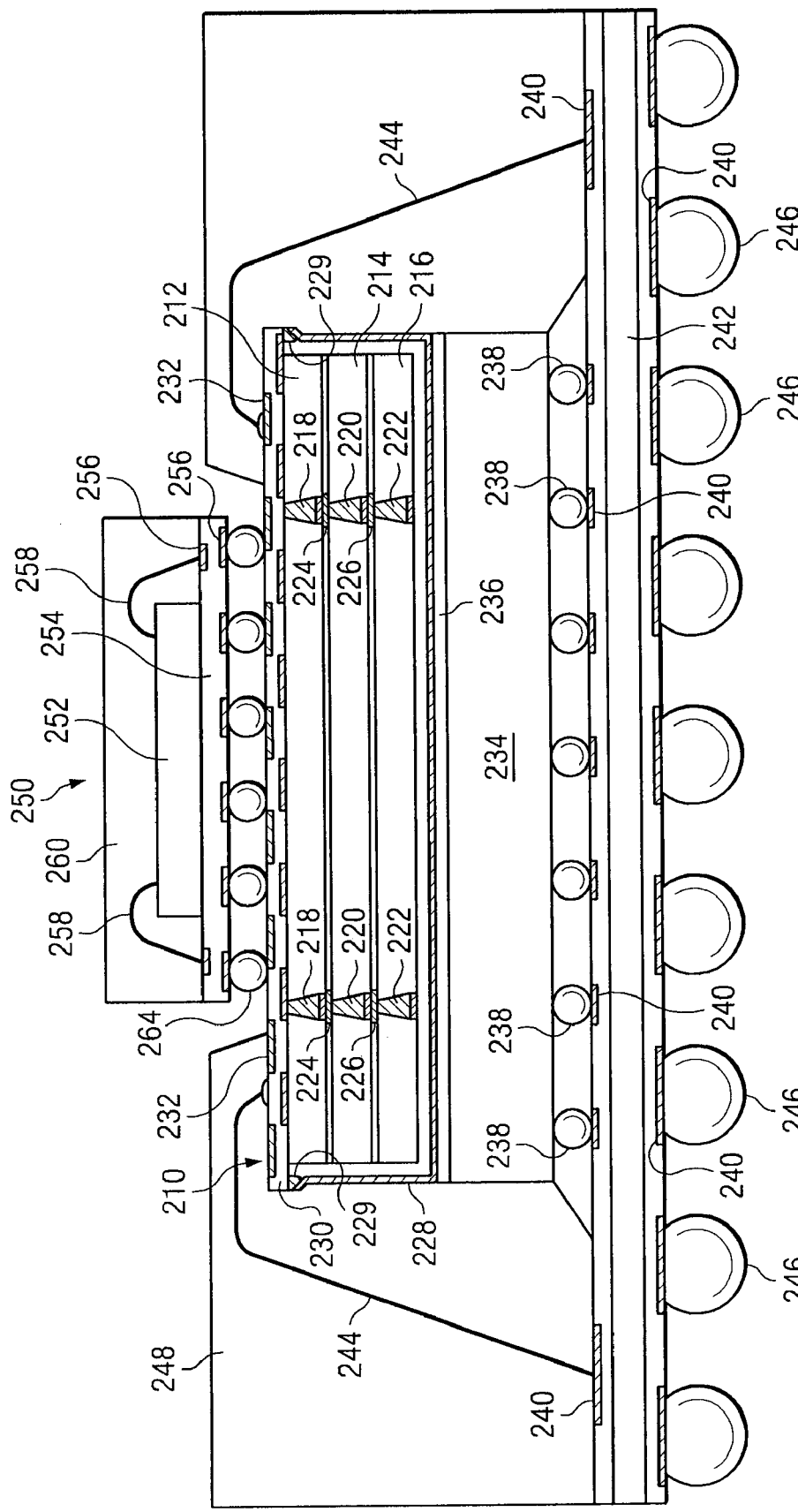
FIG. 6 illustrates an ISM covered by a shielding layer in Fi-PoP arrangement.

FIG. 6 illustrates the ISM from FIG. 4 in a fan-in package-on-package (Fi-PoP) configuration. The ISM 210 includes stacked semiconductor die 212, 214, and 216 with interconnecting conductive TSV 218, 220, and 222, respectively. TSVs 218 electrically connect to TSVs 220 through bonding agent 224. TSVs 220 electrically connect to TSVs 222 through bonding agent 226. Shielding layer 228 covers semiconductor die 212-216. A substrate 230 with build-up interconnect structure 232 is formed on the backside of semiconductor die 212. Shielding layer 228 electrically connects to build-up interconnect structure 232 through stiffener ring 229. The ISM 210 is attached to flip chip type semiconductor die or other semiconductor package 234 with adhesive material 236. Solder bumps 238 are formed on contact pads of semiconductor die 234 to electrically connect the flip chip semiconductor device to interconnect structures 240 on PCB 242. The ISM 210 also electrically connects to interconnect structures 240 in PCB 242 by way of bond wires 244. Solder bumps 246 are formed on interconnect structure 240 to provide external connectivity for the Fi-PoP device. In particular, the electrical conduction path for shielding layer 228 to an external ground point includes stiffener ring 229, interconnect structure 232, bond wire 244, interconnect structure 240, and solder bumps 246.

A molding compound or encapsulant 248 is deposited over ISM 210 and bond wires 244 and PCB 242. Molding compound 248 can be made with epoxy acrylate or other polymer material and applied by transfer molding, liquid encapsulant molding, or other molding process. Molding compound 248 is non-conductive and environmentally protects the semiconductor device from external elements and contaminants. A cavity is formed in encapsulant 248 by a contour molding process to expose substrate 230 and interconnect structure 232. Semiconductor package 250 includes semiconductor die 252 mounted to PCB 254. Semiconductor die 252 electrically connects to interconnect structure 256 in PCB 254 with bond wires 258. An encapsulant 260 is formed over semiconductor die 250 and bond wires 258 and PCB 254. The interconnect structure 256 of PCB 254 electrically connects to substrate 230 and interconnect structure 232 with solder bumps 264.

In one Fi-PoP embodiment, semiconductor die 212-216 are memory devices and semiconductor die 234 contains RF circuits. Semiconductor die 252 contains a logic control circuit for the memory. Shielding layer 228 blocks EMI, RFI, or other interference generated by die 234 from adversely influencing the operation of die 212-216 and 252.

Figure 7:
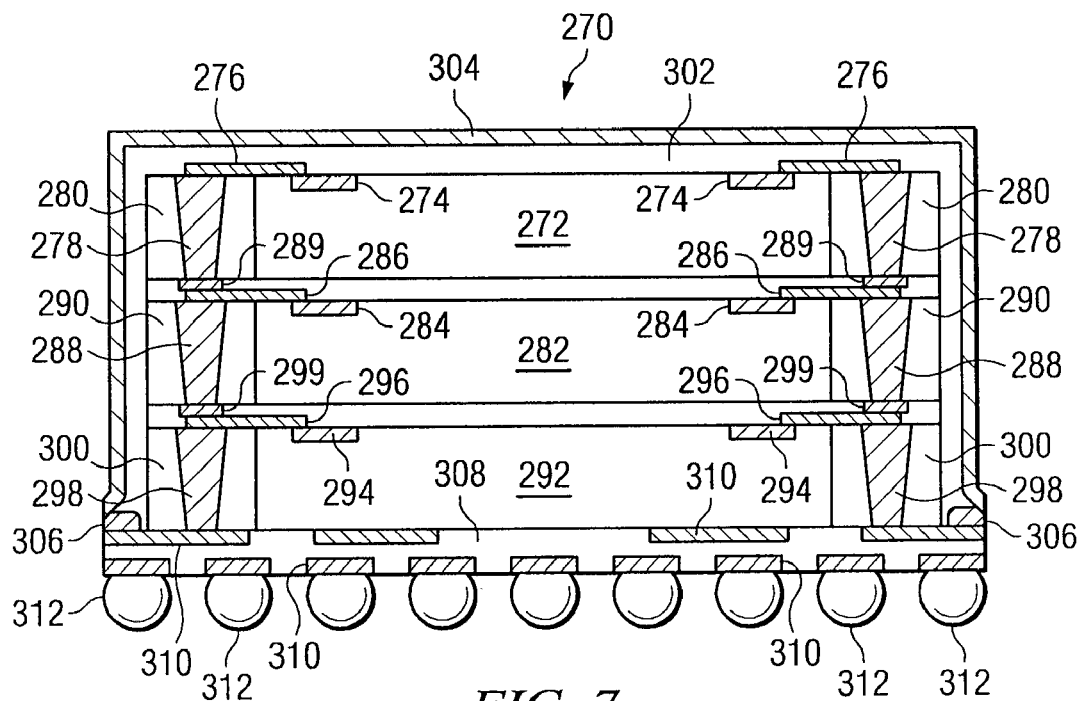
FIG. 7 illustrates an ISM covered by a shielding layer and interconnected by conductive via.

FIG. 7 illustrates ISM 270 with semiconductor die in a face-to-back arrangement. Semiconductor die 272 includes contact pads 274 formed on its active surface. Contact pads 274 are electrically connected through conductive layer 276 to conductive vias 278. Conductive layer 276 is patterned and deposited on semiconductor die 272 using an evaporation, electrolytic plating, electroless plating, or other suitable metal deposition process. Conductive layer 276 can be made with Al, Cu, Sn, Ni, Au, Ag, or other suitable conductive material. Conductive vias 278 are formed in organic material 280 around a periphery of semiconductor die 272.

To form conductive vias 278, the movement of expansion table 92 in FIG. 3d creates a separation gap of sufficient width to form conductive vias within the gap. An organic insulating material is deposited in the gap using spin coating, needle dispensing, or other suitable application process. The organic material can be BCB, PI, or acrylic resin. Alternatively, other non-conductive materials such as a polymer molding compound, liquid epoxy molding, compression molding, soft laminating film, or other material having dielectric or electrical insulating properties can be deposited in the gap. The non-conductive materials can also be deposited using a transfer molding or injection molding process. A portion of the organic material is removed by laser drilling or etching to create through hole vias (THV) extending down to expansion table 92. An electrically conductive material is deposited in the THVs with an optional seed layer. The conductive material can be Al, Cu, Sn, Ni, Au, or Ag. The seed layer can be made with Cu, Ni, NiV, Au, or Al. The seed layer and conductive material are patterned and deposited using an electrolytic plating, electroless plating, sputtering, PVD, CVD, or other suitable metal deposition process. The semiconductor wafer is singulated with a cutting tool, such as a saw blade or laser, through the organic material, or through the conductive material in the THVs. The conductive material in the THVs forms conductive vias 278 extending through organic material 280 from one side of semiconductor die 272 to the other side of the die.

Semiconductor die 282 includes contact pads 284 formed on its active surface. Contact pads 284 are electrically connected through conductive layer 286 to conductive THVs 288. The conductive THVs 288 are formed in organic material 290 around a periphery of semiconductor die 282, similar to conductive THVs 278. THVs 288 electrically connect to THVs 278 through bonding agent 289. Semiconductor die 292 includes contact pads 294 formed on its active surface. Contact pads 294 are electrically connected through conductive layer 296 to conductive THVs 298. The conductive THVs 298 are formed in organic material 300 around a periphery of semiconductor die 292, similar to conductive THVs 278. THVs 298 electrically connect to THVs 288 through bonding agent 299. Organic insulating material 302 is deposited over stacked semiconductor die 272, 282, and 292. Shielding layer 304 conformally covers stacked semiconductor die 272, 282, and 292 and electrically connects to stiffener ring 306. Shielding layer 304 isolates the semiconductor die with respect to EMI, RFI, and other inter-device interference. PCB 308 is formed on ISM 270 with a build-up process that includes interconnect structure 310. Solder bumps 312 are formed on interconnect structure 310 to provide external connectivity for ISM 270. Shielding layer 304 is electrically connected through the portion of interconnect structure 310 connected to stiffener ring 306 and through one or more solder bumps 312 which are connected to an external ground point to improve its shielding effectiveness.

Figure 8:
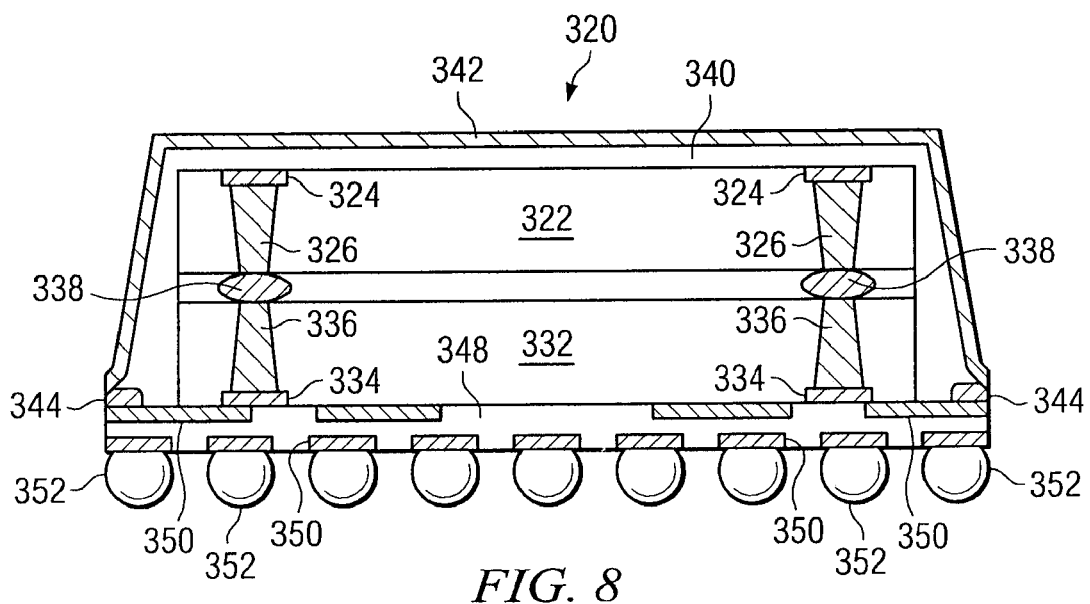
FIG. 8 illustrates a back-to-back ISM covered by a shielding layer and interconnected by conductive via.

FIG. 8 illustrates ISM 320 with semiconductor die in a back-to-back arrangement. Semiconductor die 322 includes contact pads 324 formed on its active surface. Contact pads 324 are electrically connected to conductive TSVs 326, see FIG. 3a. Semiconductor die 332 includes contact pads 334 formed on its active surface. Contact pads 334 are electrically connected to conductive TSVs 336. Conductive TSVs 326 electrically connect to conductive TSVs 336 with bonding agent 338. Organic insulating material 340 is deposited over stacked semiconductor die 322 and 332. Shielding layer 342 conformally covers stacked semiconductor die 322 and 332 and electrically connects to stiffener ring 344. Shielding layer 342 isolates the semiconductor die with respect to EMI, RFI, and other inter-device interference. PCB 348 is formed on ISM 320 with a build-up process that includes interconnect structure 350. Solder bumps 352 are formed on interconnect structure 350 to provide external connectivity for ISM 320. Shielding layer 342 is electrically connected through the portion of interconnect structure 350 connected to stiffener ring 344 and through one or more solder bumps 352 which are connected to an external ground point to improve its shielding effectiveness.

Figure 9:
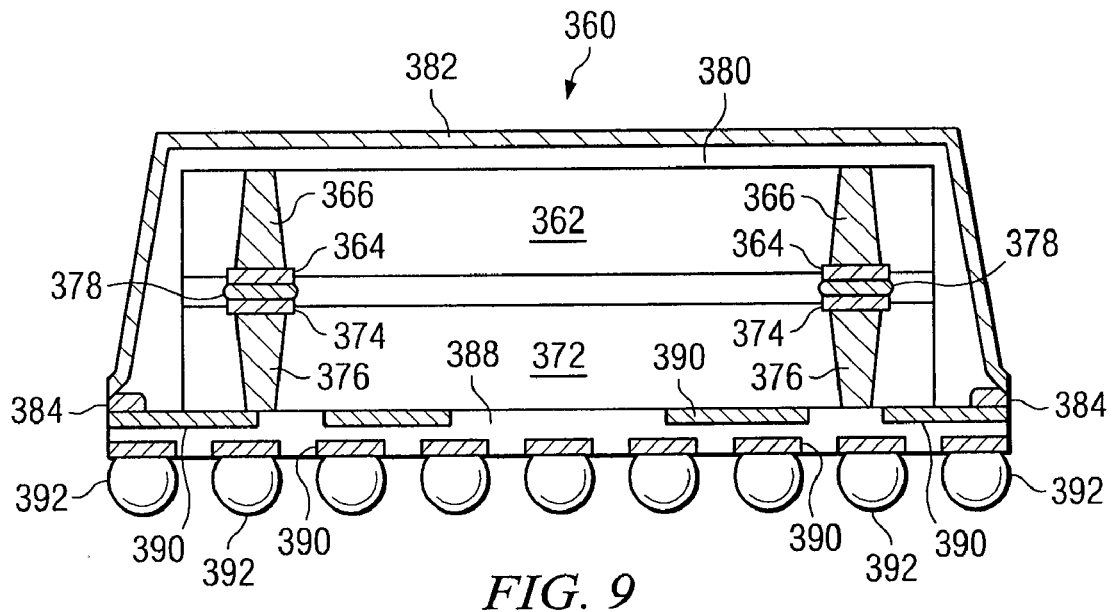
FIG. 9 illustrates a face-to-face ISM covered by a shielding layer and interconnected by conductive via.

FIG. 9 illustrates ISM 360 with semiconductor die in a face-to-face arrangement. Semiconductor die 362 includes contact pads 364 formed on its active surface. Contact pads 364 are electrically connected to conductive TSVs 366, see FIG. 3a. Semiconductor die 372 includes contact pads 374 formed on its active surface. Contact pads 374 are electrically connected to conductive TSVs 376. Contact pads 374 electrically connect to contact pads 364 with bonding agent 378. Organic insulating material 380 is deposited over stacked semiconductor die 362 and 372. Shielding layer 382 conformally covers stacked semiconductor die 362 and 372 and electrically connects to stiffener ring 384. Shielding layer 382 isolates the semiconductor die with respect to EMI, RFI, and other inter-device interference. PCB 388 is formed on ISM 360 with a build-up process that includes interconnect structure 390. Solder bumps 392 are formed on interconnect structure 390 to provide external connectivity for ISM 360. Shielding layer 382 is electrically connected through the portion of interconnect structure 390 connected to stiffener ring 384 and through one or more solder bumps 392 which are connected to an external ground point to improve its shielding effectiveness.

Figure 10:
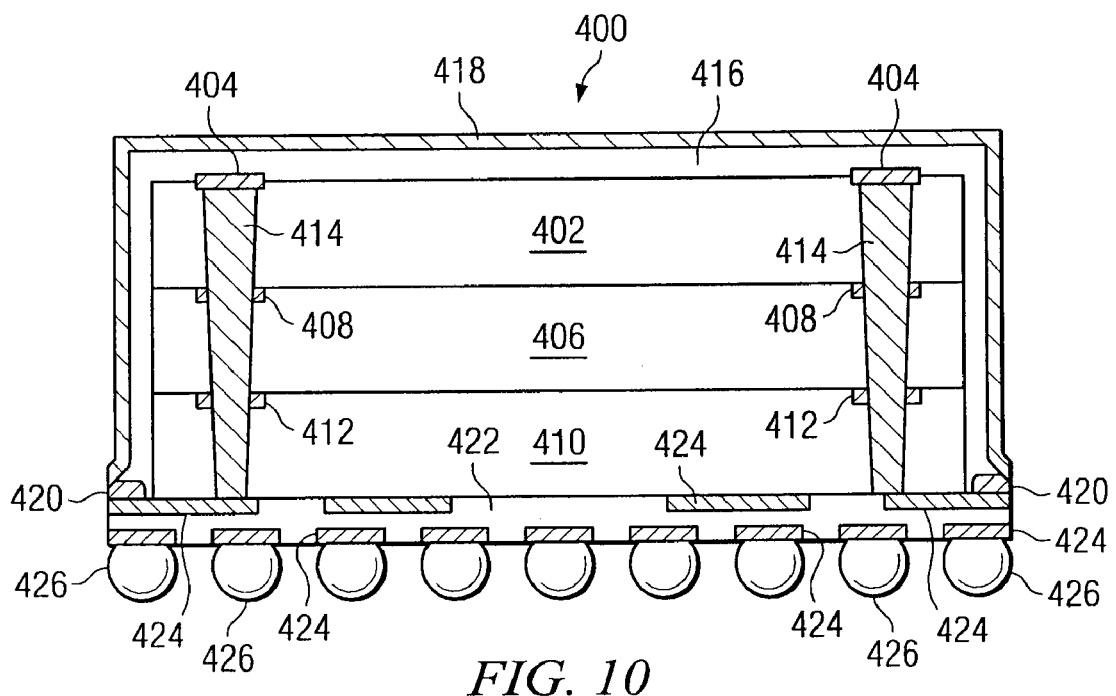
FIG. 10 illustrates an ISM covered by a shielding layer and interconnected by conductive via extending through stacked die.

FIG. 10 illustrates ISM 400 with semiconductor die in a face-to-back arrangement. Semiconductor die 402 includes contact pads 404 formed on its active surface. Semiconductor die 406 includes contact pads 408 formed on its active surface. Semiconductor die 410 includes contact pads 412 formed on its active surface. Conductive TSVs 414 extend through stacked semiconductor die 402, 406, and 410 and electrically connect contact pads 404, 408, and 412. Each conductive TSV 414 extends through all stacked semiconductor die 402, 406, and 410. Organic insulating material 416 is deposited over stacked semiconductor die 402, 406, and 410. Shielding layer 418 conformally covers stacked semiconductor die 402, 406, and 410 and electrically connects to stiffener ring 420. Shielding layer 418 isolates the semiconductor die with respect to EMI, RFI, and other inter-device interference. PCB 422 is formed on ISM 400 with a build-up process that includes interconnect structure 424. Solder bumps 426 are formed on interconnect structure 424 to provide external connectivity for ISM 400. Shielding layer 418 is electrically connected through the portion of interconnect structure 424 connected to stiffener ring 420 and through one or more solder bumps 426 which are connected to an external ground point to improve its shielding effectiveness.

Figure 11:
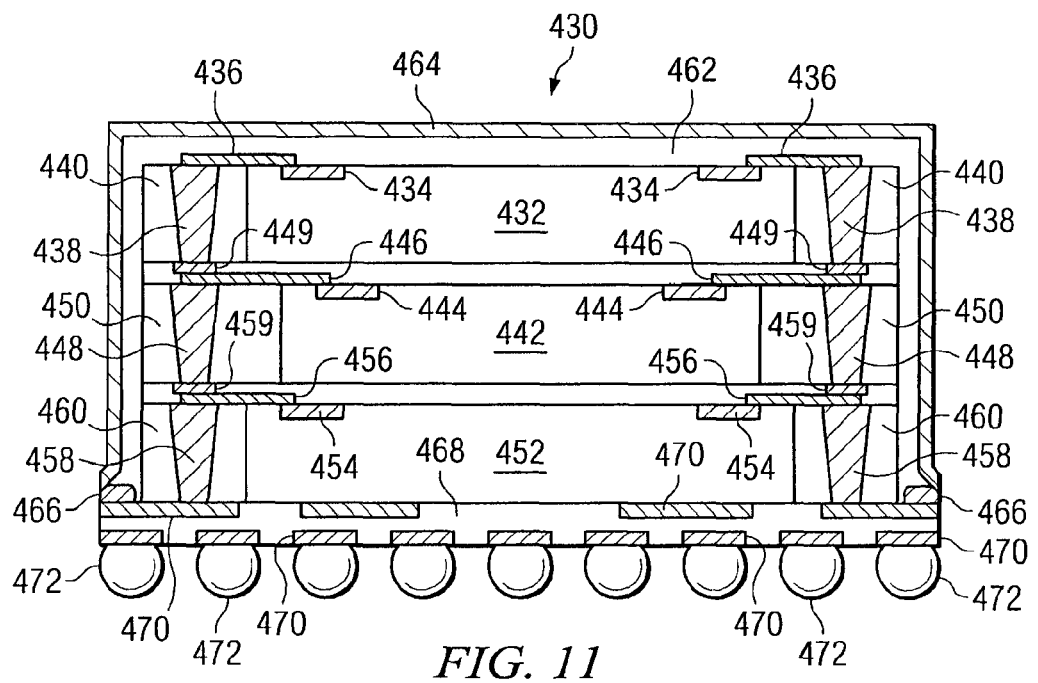
FIG. 11 illustrates an ISM of differing size die covered by a shielding layer and interconnected by conductive via.

FIG. 11 illustrates ISM 430 with semiconductor die in a face-to-back arrangement. Semiconductor die 432 includes contact pads 434 formed on its active surface. Contact pads 434 are electrically connected through conductive layer 436 to conductive vias 438. Conductive layer 436 is patterned and deposited on semiconductor die 432 using an evaporation, electrolytic plating, electroless plating, or other suitable metal deposition process. Conductive layer 436 can be made with Al, Cu, Sn, Ni, Au, Ag, or other suitable conductive material. The conductive vias 438 are formed in organic material 440 around a periphery of semiconductor die 432.

To form conductive vias 438, the movement of expansion table 92 in FIG. 3d creates a separation gap of sufficient width to form conductive vias within the gap. An organic insulating material is deposited in the gap using spin coating, needle dispensing, or other suitable application process. The organic material can be BCB, PI, or acrylic resin. Alternatively, other non-conductive materials such as a polymer molding compound, liquid epoxy molding, compression molding, soft laminating film, or other material having dielectric or electrical insulating properties can be deposited in the gap. The non-conductive materials can also be deposited using a transfer molding or injection molding process. A portion of the organic material is removed by laser drilling or etching to create THVs extending down to expansion table 92. An electrically conductive material is deposited in the THVs with an optional seed layer. The conductive material can be Al, Cu, Sn, Ni, Au, or Ag. The seed layer can be made with Cu, Ni, NiV, Au, or Al. The seed layer and conductive material are patterned and deposited using an electrolytic plating, electroless plating, sputtering, PVD, CVD, or other suitable metal deposition process. The semiconductor wafer is singulated with a cutting tool, such as a saw blade or laser, through the organic material, or through the conductive material in the THVs. The conductive material in the THVs forms conductive vias 438 extending through organic material 440 from one side of semiconductor die 432 to the other side of the die.

Semiconductor die 442 includes contact pads 444 formed on its active surface. Contact pads 444 are electrically connected through conductive layer 446 to conductive THVs 448. The conductive THVs 448 are formed in organic material 450 around a periphery of semiconductor die 442, similar to conductive THVs 438. THVs 448 electrically connect to THVs 438 through bonding agent 449. Semiconductor die 452 includes contact pads 454 formed on its active surface. Contact pads 454 are electrically connected through conductive layer 456 to conductive THVs 458. The conductive THVs 458 are formed in organic material 460 around a periphery of semiconductor die 452, similar to conductive THVs 438. THVs 458 electrically connect to THVs 448 through bonding agent 459. Semiconductor die 432, 442, and 452 differ in size, i.e., die 442 is smaller than die 432 or 452. Organic insulating material 462 is deposited over stacked semiconductor die 432, 442, and 452. Shielding layer 464 conformally covers stacked semiconductor die 432, 442, and 452 and electrically connects to stiffener ring 466. Shielding layer 464 isolates the semiconductor die with respect to EMI, RFI, and other inter-device interference. PCB 468 is formed on ISM 430 with a build-up process that includes interconnect structure 470. Solder bumps 472 are formed on interconnect structure 470 to provide external connectivity for ISM 430. Shielding layer 464 is electrically connected through the portion of interconnect structure 470 connected to stiffener ring 466 and through one or more solder bumps 472 which are connected to an external ground point to improve its shielding effectiveness.

Figure 12:
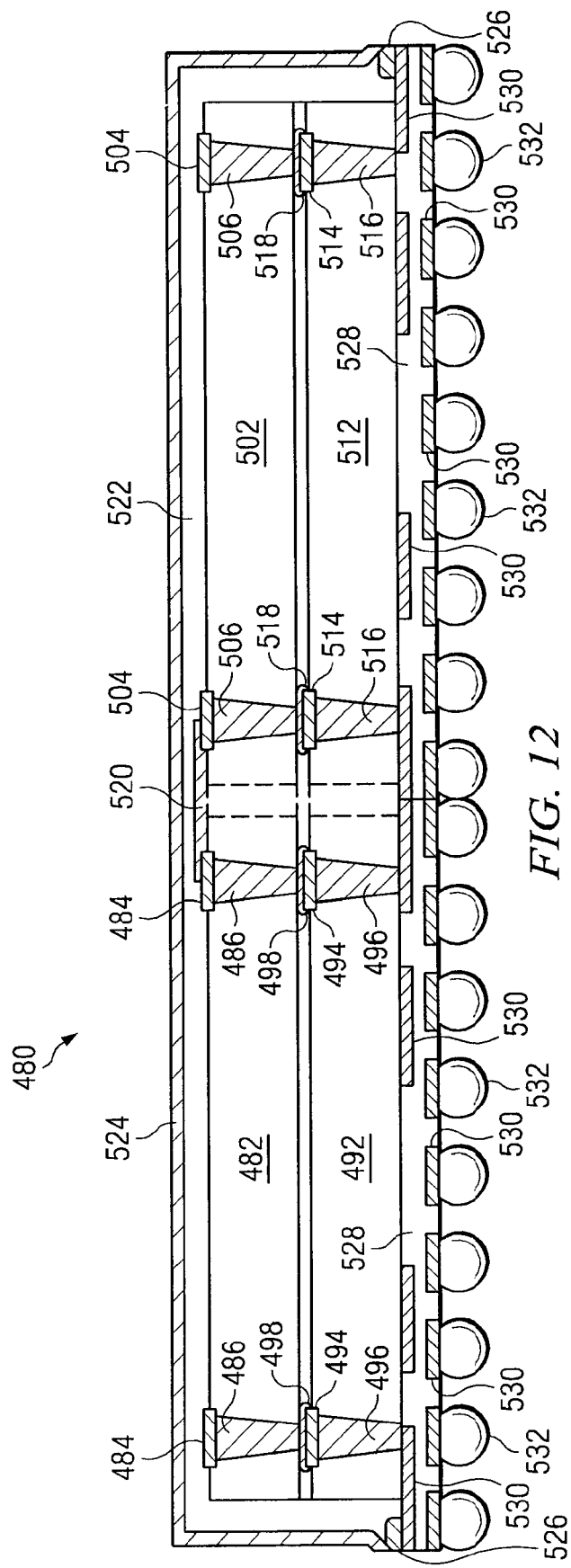
FIG. 12 illustrates an ISM with side-by-side stacked semiconductor die covered by a shielding layer and interconnected by conductive via.

FIG. 12 illustrates ISM 480 with semiconductor die in a face-to-back arrangement. Semiconductor die 482 includes contact pads 484 formed on its active surface. Contact pads 484 are electrically connected to conductive TSVs 486, see FIG. 3a. Semiconductor die 492 includes contact pads 494 formed on its active surface. Contact pads 494 are electrically connected to conductive TSVs 496. Conductive TSVs 486 electrically connect to conductive TSVs 496 with bonding agent 498. Semiconductor die 502 includes contact pads 504 formed on its active surface. Contact pads 504 are electrically connected to conductive TSVs 506, see FIG. 3a. Semiconductor die 512 includes contact pads 514 formed on its active surface. Contact pads 514 are electrically connected to conductive TSVs 516. Conductive TSVs 516 electrically connect to conductive TSVs 506 with bonding agent 518. Conductive layer 520 is patterned and deposited on semiconductor die 482 and 502 using an evaporation, electrolytic plating, electroless plating, or other suitable metal deposition process. Conductive layer 520 can be made with Al, Cu, Sn, Ni, Au, Ag, or other suitable conductive material. Organic insulating material 522 is deposited over stacked semiconductor die 482, 492, 502, and 512. Shielding layer 524 conformally covers stacked semiconductor die 482, 492, 502, and 512 and electrically connects to stiffener ring 526. Shielding layer 524 isolates the semiconductor die with respect to EMI, RFI, and other inter-device interference. PCB 528 is formed on ISM 480 with a build-up process that includes interconnect structure 530. Solder bumps 532 are formed on interconnect structure 530 to provide external connectivity for ISM 480. Shielding layer 524 is electrically connected through the portion of interconnect structure 530 connected to stiffener ring 526 and through one or more solder bumps 532 which are connected to an external ground point to improve its shielding effectiveness.

FIG. 13 illustrates ISM 540 with semiconductor die in a face-to-back arrangement. Semiconductor die 542 includes contact pads 544 formed on its active surface. Contact pads 544 are electrically connected to conductive TSVs 546, see FIG. 3a. Semiconductor die 552 includes contact pads 554 formed on its active surface. Contact pads 554 are electrically connected to conductive TSVs 556. Conductive TSVs 546 electrically connect to conductive TSVs 556 with bonding agent 558. Semiconductor die 562 includes contact pads 564 formed on its active surface. Contact pads 564 are electrically connected to conductive TSVs 566. Conductive TSVs 556 electrically connect to conductive TSVs 566 with bonding agent 568. Organic insulating material 570 is deposited over stacked semiconductor die 542, 552, and 562. Shielding layer 572 conformally covers stacked semiconductor die 542, 552, and 562 and electrically connects to stiffener ring 576. Shielding layer 572 isolates the semiconductor die with respect to EMI, RFI, and other inter-device interference. Shielding layer 572 also electrically connects to TSV 544 of semiconductor die 542 with conduction channel or bonding agent 578. PCB 580 is formed on ISM 540 with a build-up process that includes interconnect structure 582. Solder bumps 584 are formed on interconnect structure 530 to provide external connectivity for ISM 540. Shielding layer 572 is electrically connected through the portion of interconnect structure 582 connected to stiffener ring 576 and through one or more solder bumps 584 which are connected to an external ground point to improve its shielding effectiveness.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first semiconductor wafer having a plurality of semiconductor die;
    mounting a second semiconductor wafer having a plurality of semiconductor die over the first semiconductor wafer so that the plurality of semiconductor die in the first and second semiconductor wafers are aligned;
    creating a gap between the aligned semiconductor die of the first and second semiconductor wafers;
    depositing a conductive material in a bottom portion of the gap;
    depositing an insulating material in the gap, over the conductive material, and over the aligned semiconductor die of the first and second semiconductor wafers;
    removing a portion of the insulating material and a tapered portion of the conductive material in the gap to form a recess between each aligned semiconductor die of the first and second semiconductor wafers extending to the conductive material;
    forming a shielding layer over the insulating material and in the recess that contacts the conductive material to isolate the aligned semiconductor die of the first and second semiconductor wafers with respect to inter-device interference;
    forming a substrate with a build-up structure on the plurality of semiconductor die of the first semiconductor wafer adjacent to the conductive material;
    electrically connecting the conductive material to a ground point in the substrate; and
    singulating the first and second semiconductor wafers through the gap to separate the aligned semiconductor die of the first and second semiconductor wafers.

2. The method of claim 1, further including forming a conductive via in each semiconductor die of the first and second semiconductor wafer.

3. The method of claim 2, further including
electrically connecting one semiconductor die in the first semiconductor wafer to one semiconductor die in the second semiconductor wafer through the conductive via.

4. The method of claim 3, further including electrically connecting the shielding layer to the one semiconductor die in the second semiconductor wafer through the conductive via.

5. The method of claim 3, further including disposing a bonding agent between the conductive via in the one semiconductor die in the first semiconductor wafer and the conductive via in the one semiconductor die in the second semiconductor wafer to electrically connect the conductive via.

6. The method of claim 1, further including
forming conductive vias which extend through each aligned semiconductor die in the first and second semiconductor wafers to electrically connect the semiconductor die.

7. The method of claim 1, further including:
forming a conductive via in a periphery region of each semiconductor die of the first and second semiconductor wafers; and
electrically connecting one semiconductor die in the first semiconductor wafer to one semiconductor die in the second semiconductor wafer through the conductive via.

8. A method of making a semiconductor device, comprising:
providing a first semiconductor wafer having a plurality of semiconductor die;
creating a gap between the plurality of semiconductor die of the first semiconductor wafer;
depositing a conductive material in a bottom portion of the gap;
depositing an insulating material in the gap, over the conductive material, and over the plurality of semiconductor die of the first semiconductor wafer;
removing a portion of the insulating material and a portion of the conductive material in the gap to form a recess between the plurality of semiconductor die;
forming a shielding layer over the insulating material and in the recess to contact the conductive material and isolate the plurality of semiconductor die with respect to inter-device interference; and
singulating the first semiconductor wafer through the gap to separate the plurality of semiconductor die.

9. The method of claim 8, further including:
forming a substrate with a build-up structure on the plurality of semiconductor die adjacent to the conductive material; and
electrically connecting the conductive material to a ground point in the substrate.

10. The method of claim 8, further including:
disposing a second semiconductor wafer having a plurality of semiconductor die over the first semiconductor wafer prior to creating the gap;
forming a conductive via in each semiconductor die of the first and second semiconductor wafers; and
electrically connecting one semiconductor die in the first semiconductor wafer to one semiconductor die in the second semiconductor wafer through the conductive via.

11. The method of claim 10, further including disposing a bonding agent between the conductive via in the one semiconductor die in the first semiconductor wafer and the conductive via in the one semiconductor die in the second semiconductor wafer to electrically connect the conductive via.

12. The method of claim 10, further including electrically connecting the shielding layer to one of the plurality of semiconductor die in the second semiconductor wafer through the conductive via.

13. The method of claim 8, further including:
disposing a second semiconductor wafer having a plurality of semiconductor die over the first semiconductor wafer to align the plurality of semiconductor die in the first and second wafers prior to creating the gap; and
forming a conductive via which extends through each aligned semiconductor die in the first and second semiconductor wafers to electrically connect the semiconductor die.

14. The method of claim 10,
wherein the conductive via is formed in a periphery region of each semiconductor die of the first and second semiconductor wafers.

15. A method of making a semiconductor device, comprising:
creating a gap between a plurality of semiconductor die;
depositing a conductive material in a bottom portion of the gap;
depositing an insulating material in the gap, over the conductive material, and over the plurality of semiconductor die;
removing a portion of the insulating material in the gap to form a recess between each semiconductor die extending to the conductive material; and
forming a shielding layer over the insulating material and in the recess to contact the conductive material and isolate the plurality of semiconductor die with respect to inter-device interference.

16. The method of claim 15, further including:
forming a substrate with a build-up structure over the plurality of semiconductor die adjacent to the conductive material; and
electrically connecting the conductive material to a ground point in the substrate.

17. The method of claim 15, further including:
forming a conductive via in each of the plurality of semiconductor die;
stacking the plurality of semiconductor die prior to forming the gap; and
electrically connecting the stacked plurality of semiconductor die through the conductive via.

18. The method of claim 17, wherein
the conductive vias are formed in a periphery region of each semiconductor die.

19. The method of claim 15, further including:
stacking the plurality of semiconductor die within a semiconductor package; and
electrically connecting the plurality of semiconductor die to the semiconductor package bond wires or solder bumps.

20. A method of making a semiconductor device, comprising:
creating a gap between a plurality of semiconductor die;
depositing a conductive material in a bottom portion of the gap;
depositing an insulating material in the gap and over the plurality of semiconductor die; and
forming a shielding layer over the insulating material and in the gap to contact the conductive material and isolate the plurality of semiconductor die with respect to inter-device interference.

21. The method of claim 20, further including removing a portion of the insulating material in the gap to form a recess between each semiconductor die extending to the conductive material.

22. The method of claim 20, further including:
- forming a substrate with a build-up structure over the plurality of semiconductor die adjacent to the conductive material; and
- electrically connecting the conductive material to a ground point in the substrate.

23. The method of claim 20, further including:
- forming a conductive via in each of the plurality of semiconductor die;
- stacking the plurality of semiconductor die prior to forming the gap; and
- electrically connecting the stacked plurality of semiconductor die through the conductive via.

24. The method of claim 20, further including:
- stacking the plurality of semiconductor die within a semiconductor package; and
- electrically connecting the plurality of semiconductor die to the semiconductor package bond wires or solder bumps.

25. The method of claim 20, wherein the plurality of semiconductor die are organized on a first and second semiconductor wafer.

* * * * *